United States Patent
Yasuda

(10) Patent No.: US 11,336,260 B2
(45) Date of Patent: May 17, 2022

(54) FILTER MODULE

(71) Applicant: Murata Manufacturing Co., Ltd., Nagaokakyo (JP)

(72) Inventor: Junpei Yasuda, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 63 days.

(21) Appl. No.: 16/898,593

(22) Filed: Jun. 11, 2020

(65) Prior Publication Data

US 2020/0304100 A1 Sep. 24, 2020

Related U.S. Application Data

(63) Continuation of application No. PCT/JP2018/048119, filed on Dec. 27, 2018.

(30) Foreign Application Priority Data

Dec. 28, 2017 (JP) .............................. JP2017-254382

(51) Int. Cl.
  *H03H 9/54* (2006.01)
  *H03F 3/04* (2006.01)
  *H03H 9/17* (2006.01)

(52) U.S. Cl.
  CPC ................ *H03H 9/54* (2013.01); *H03F 3/04* (2013.01); *H03H 9/17* (2013.01); *H03F 2200/165* (2013.01); *H03F 2200/171* (2013.01)

(58) Field of Classification Search
  CPC .... H03H 9/54; H03H 9/17; H03F 3/04; H03F 2200/165; H03F 2200/171

(Continued)

(56) References Cited

U.S. PATENT DOCUMENTS 6,676,602 B1 * 1/2004 Barnes ................ G10K 11/346
                                                  600/443
2006/0205352 A1  9/2006 Bialek et al.
(Continued)

FOREIGN PATENT DOCUMENTS

JP  2005-057342 A  3/2005
JP  2008-118624 A  5/2008
(Continued)

OTHER PUBLICATIONS

Official Communication issued in International Patent Application No. PCT/JP2018/048119, dated Mar. 19, 2019.
(Continued)

*Primary Examiner* — Hafizur Rahman
(74) *Attorney, Agent, or Firm* — Keating & Bennett, LLP

(57) ABSTRACT

A filter module includes a filter provided on a path connecting an input/output terminal and an input/output terminal, a filter provided on a path connecting an input/output terminal and an input/output terminal, a switch that switches between electrical connection and electrical disconnection between a wire connected to the input/output terminal and a ground, and a switch that switches between electrical connection and electrical disconnection between a wire connected to the input/output terminal and the ground. When the wire and the ground are electrically connected by the switch, the wire and the ground are electrically disconnected by the switch, and when the wire and the ground are electrically connected by the switch, the wire and the ground are electrically disconnected by the switch.

19 Claims, 9 Drawing Sheets

(58) Field of Classification Search
USPC .......................................................... 330/294
See application file for complete search history.

(56) References Cited

U.S. PATENT DOCUMENTS

| | | |
|---|---|---|
| 2008/0088376 A1 | 4/2008 | Tateoka et al. |
| 2014/0308906 A1* | 10/2014 | Saji ..................... H01L 23/5389 |
| | | 455/83 |
| 2017/0331458 A1 | 11/2017 | Tomita et al. |

FOREIGN PATENT DOCUMENTS

| | | |
|---|---|---|
| JP | 2008-533914 A | 8/2008 |
| JP | 2009-225198 A | 10/2009 |
| JP | 2014-154942 A | 8/2014 |
| JP | 2017-204761 A | 11/2017 |

OTHER PUBLICATIONS

Official Communication issued in corresponding Japanese Patent Application No. 2019-562159 drafted on Aug. 20, 2021.

* cited by examiner

FILTER MODULE

CROSS REFERENCE TO RELATED APPLICATIONS

This application claims the benefit of priority to Japanese Patent Application No. 2017-254382 filed on Dec. 28, 2017 and is a Continuation Application of PCT Application No. PCT/JP2018/048119 filed on Dec. 27, 2018. The entire contents of each application are hereby incorporated herein by reference.

BACKGROUND OF THE INVENTION

1. Field of the Invention

The present invention relates to a filter module.

2. Description of the Related Art

In recent years, development of a wireless terminal supporting multiple bands has been progressing. Whereas the number of filters to be provided increases so as to support a plurality of frequency bands, a reduction in size of the wireless terminal is demanded.

Responding to the demand, for example, a filter module in which a plurality of filters is collectively provided in or on one substrate has been disclosed (for example, Japanese Unexamined Patent Application Publication No. 2005-057342). The size of the filter module is reduced by collectively providing the filters in or on one substrate and consequently the size of the wireless terminal is reduced.

However, in the filter module of the related art, for example, a plurality of filters, of which pass bands are frequency bands different from each other, are arranged in or on the same substrate, and filters having close frequency bands are arranged adjacent to each other in some cases. In this case, the signals passing through the filters interfere with each other, and there is a possibility that isolation between wires connected to the respective filters may not be sufficiently ensured. As a result, attenuation characteristics of the filter may be deteriorated, and the desired function may not be exhibited.

To cope with this, it is conceivable to suppress deterioration of the attenuation characteristics by increasing the number of ground terminals on the one substrate, but in this case, since the substrate is larger due to the increase of the number of ground terminals, it is difficult to achieve miniaturization.

SUMMARY OF THE INVENTION

Preferred embodiments of the present invention provide filter modules that are each able to significantly reduce or prevent the deterioration of attenuation characteristics while reducing the size thereof.

A filter module according to a preferred embodiment of the present invention includes a first input/output terminal, a second input/output terminal, a first filter provided on a path connecting the first input/output terminal and the second input/output terminal; a third input/output terminal, a fourth input/output terminal, a second filter provided on a path connecting the third input/output terminal and the fourth input/output terminal; a first substrate in or on which the first input/output terminal, the second input/output terminal, the first filter, the third input/output terminal, the fourth input/output terminal, and the second filter are provided; a first wire connected to the first input/output terminal and through which a signal passing through the first filter is propagated, a first switch switching between electrical connection and electrical disconnection between the first wire and the ground; a second wire connected to the third input/output terminal and through which a signal passing through the second filter is propagated, and a second switch switching between electrical connection and electrical disconnection between the second wire and the ground. When the first wire and the ground are electrically connected by the first switch, the second wire and the ground are electrically disconnected by the second switch, and when the second wire and the ground are electrically connected by the second switch, the first wire and the ground are electrically disconnected by the first switch.

Since the first filter and the second filter are collectively provided in or on the first substrate, the first input/output terminal of the first filter and the third input/output terminal of the second filter may be provided adjacent to or in a vicinity of one another. Accordingly, the first wire connected to the first input/output terminal and the second wire connected to the third input/output terminal may be close to each other, and sufficient isolation between the wires may not be provided.

To provide sufficient isolation, for example, in a case where the pass band of the first filter and the pass band of the second filter are different from each other, when the communication in the pass band of the first filter is performed and the communication in the pass band of the second filter is not performed, the second wire and the ground are electrically connected by the second switch. That is, the second wire and the third input/output terminal connected to the second wire have a ground electrical potential. Therefore, the ground (third input/output terminal and second wire) is provided adjacent to or in a vicinity of the first input/output terminal and the first wire, and the deterioration of attenuation characteristics of the first filter is able to be significantly reduced or prevented. Similarly, for example, when the communication in the pass band of the second filter is performed and the communication in the pass band of the first filter is not performed, the first wire and the ground are electrically connected by the first switch. That is, the first wire and the first input/output terminal connected to the first wire have the ground electrical potential. Thus, the ground (first input/output terminal and first wire) is provided adjacent to or in a vicinity of the third input/output terminal and the second wire, and the deterioration of attenuation characteristics of the second filter is able to be significantly reduced or prevented. Further, since the number of ground terminals is not increased and the input/output terminal for a high frequency signal connected to the respective filters may also be operated as the ground terminal, a significant reduction in size is able to be provided. As described above, the deterioration of attenuation characteristics is able to be significantly reduced or prevented while providing a significant reduction in size.

For example, the first switch may be a single pole single throw (SPST) switch, and a SPST switch that switches between electrical connection and electrical disconnection between the first wire and an input/output terminal of a signal passing through the first filter may further be included.

For example, the first switch may be a single pole double throw (SPDT) switch, the first wire may be connected to a common terminal of the first switch, and an input/output terminal of a signal passing through the first filter may be connected to one of two selection terminals of the first switch, and the ground may be connected to the other of the two selection terminals.

For example, the second switch may be a SPST switch, and a SPST switch that switches between electrical connection and electrical disconnection between the second wire and an input/output terminal of a signal passing through the second filter may further be included.

For example, the second switch may be a SPDT switch, the second wire may be connected to a common terminal of the second switch, and an input/output terminal of a signal passing through the second filter may be connected to one of two selection terminals of the second switch, and the ground may be connected to the other of the two selection terminals.

For example, the filter module may further include a second substrate, and the first switch and the second switch may be provided in or on the second substrate. Further, for example, the first switch and the second switch may be provided in or on one chip.

The filter module may further include a third wire connected to the second input/output terminal and through which a signal passing through the first filter is propagated, a third switch switching between electrical connection and electrical disconnection between the third wire and the ground, a fourth wire connected to the fourth input/output terminal and through which a signal passing through the second filter is propagated, a fourth switch switching between electrical connection and electrical disconnection between the fourth wire and the ground. When the first wire and the ground are electrically connected by the first switch and the third wire and the ground are electrically connected by the third switch, the second wire and the ground may be electrically disconnected by the second switch and the fourth wire and the ground may be electrically disconnected by the fourth switch. When the second wire and the ground are electrically connected by the second switch and the fourth wire and the ground are electrically connected by the fourth switch, the first wire and the ground may be electrically disconnected by the first switch and the third wire and the ground may be electrically disconnected by the third switch.

Since the first filter and the second filter are collectively provided in or on the first substrate, the second input/output terminal of the first filter and the fourth input/output terminal of the second filter may also be provided adjacent to or in a vicinity of one another. With this, the third wire connected to the second input/output terminal and the fourth wire connected to the fourth input/output terminal may be close to each other, and sufficient isolation between the wires may not be provided.

For example, when the communication in the pass band of the first filter is performed and the communication in the pass band of the second filter is not performed, the second wire and the ground are electrically connected by the second switch, and the fourth wire and the ground are electrically connected by the fourth switch. That is, both of the wire connected to the input terminal of the second filter and the wire connected to the output terminal of the second filter, not one of them, are electrically connected to the ground. Therefore, the ground (third input/output terminal, fourth input/output terminal, second wire, and fourth wire) is provided adjacent to or in a vicinity of the first input/output terminal, the second input/output terminal, the first wire, and the third wire, and thus the deterioration of attenuation characteristics of the first filter is able to be further significantly reduced or prevented. Similarly, for example, when the communication in the pass band of the second filter is performed and the communication in the pass band of the first filter is not performed, the first wire and the ground are electrically connected by the first switch, and the third wire and the ground are electrically connected by the third switch. That is, both of the wire connected to the input terminal of the first filter and the wire connected to the output terminal of the first filter, not one of them, are electrically connected to the ground. Therefore, the ground (first input/output terminal, second input/output terminal, first wire, and third wire) is provided adjacent to or in a vicinity of the third input/output terminal, the fourth input/output terminal, the second wire, and the fourth wire, and thus the deterioration of attenuation characteristics of the second filter is able to be further significantly reduced or prevented.

For example, the third switch may be a SPST switch, and a SPST switch that switches between electrical connection and electrical disconnection between the third wire and an input/output terminal of a signal passing through the first filter may further be included.

For example, the third switch may be a SPDT switch, the third wire may be connected to a common terminal of the third switch, and an input/output terminal of a signal passing through the first filter may be connected to one of two selection terminals of the third switch, and the ground may be connected to the other of the two selection terminals.

For example, the fourth switch may be a SPST switch, and a SPST switch that switches between electrical connection and electrical disconnection between the fourth wire and an input/output terminal of a signal passing through the second filter may further be included.

For example, the fourth switch may be a SPDT switch, the fourth wire may be connected to a common terminal of the fourth switch, and an input/output terminal of a signal passing through the second filter may be connected to one of two selection terminals of the fourth switch, and the ground may be connected to the other of the two selection terminals.

For example, the filter module may further include a second substrate, and the first switch, the second switch, the third switch, and the fourth switch may be provided in or on the second substrate. Further, for example, the first switch, the second switch, the third switch, and the fourth switch may be provided in or on one chip.

The filter module may further include an amplification circuit that includes a first input terminal connected to the first filter, a second input terminal connected to the second filter, and an output terminal, that amplifies either one of a signal passing through the first filter and inputted to the first input terminal or a signal passing through the second filter and inputted to the second input terminal, and that outputs an amplified signal from the output terminal, a fifth switch switching between electrical connection and electrical disconnection between the first input terminal and the ground and a sixth switch switching between electrical connection and electrical disconnection between the second input terminal and the ground. When the first wire and the ground are electrically connected by the first switch, the first input terminal and the ground may be electrically connected by the fifth switch and the second input terminal and the ground may be electrically disconnected by the sixth switch, and when the second wire and the ground are electrically connected by the second switch, the first input terminal and the ground may be electrically disconnected by the fifth switch and the second input terminal and the ground may be electrically connected by the sixth switch.

For example, when the communication in the pass band of the first filter is performed and the communication in the pass band of the second filter is not performed, the second input terminal of the amplification circuit and the ground are electrically connected by the sixth switch. Further, for example, when the communication in the pass band of the second filter is performed and the communication in the pass band of the first filter is not performed, the first input terminal of the amplification circuit and the ground are electrically connected by the fifth switch. That is, since the first input terminal or second input terminal of the amplification circuit, which is not used for the communication, is electrically connected to the ground, malfunctioning of the amplification circuit is able to be significantly reduced or prevented.

For example, the filter module may further include a second substrate, and the first switch, the second switch, the third switch, the fourth switch, the fifth switch, and the sixth switch may be provided in or on the second substrate. Further, for example, the first switch, the second switch, the third switch, the fourth switch, the fifth switch, the sixth switch, and the amplification circuit may be provided in or on one chip.

Further, at least one ground terminal connected to the first filter and the second filter may be provided in or on the first substrate, and the first input/output terminal and the third input/output terminal may be adjacent to each other without the at least any one ground terminal placed in between, and the second input/output terminal and the fourth input/output terminal may be adjacent to each other without the at least any one ground terminal placed in between.

Accordingly, it is not necessary to provide the ground terminal between the first input/output terminal and the third input/output terminal and between the second input/output terminal and the fourth input/output terminal to provide isolation between the wires connected to the respective filters, and thus a degree of freedom in design is able to be significantly increased.

Further, the pass band of the first filter and the pass band of the second filter may be different bands from each other.

Accordingly, multiple bands in frequency bands that are different from each other are able to be supported.

With the filter modules according to preferred embodiments of the present invention, the deterioration of attenuation characteristics is able to be significantly reduced or prevented while reducing the size of the filter modules.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
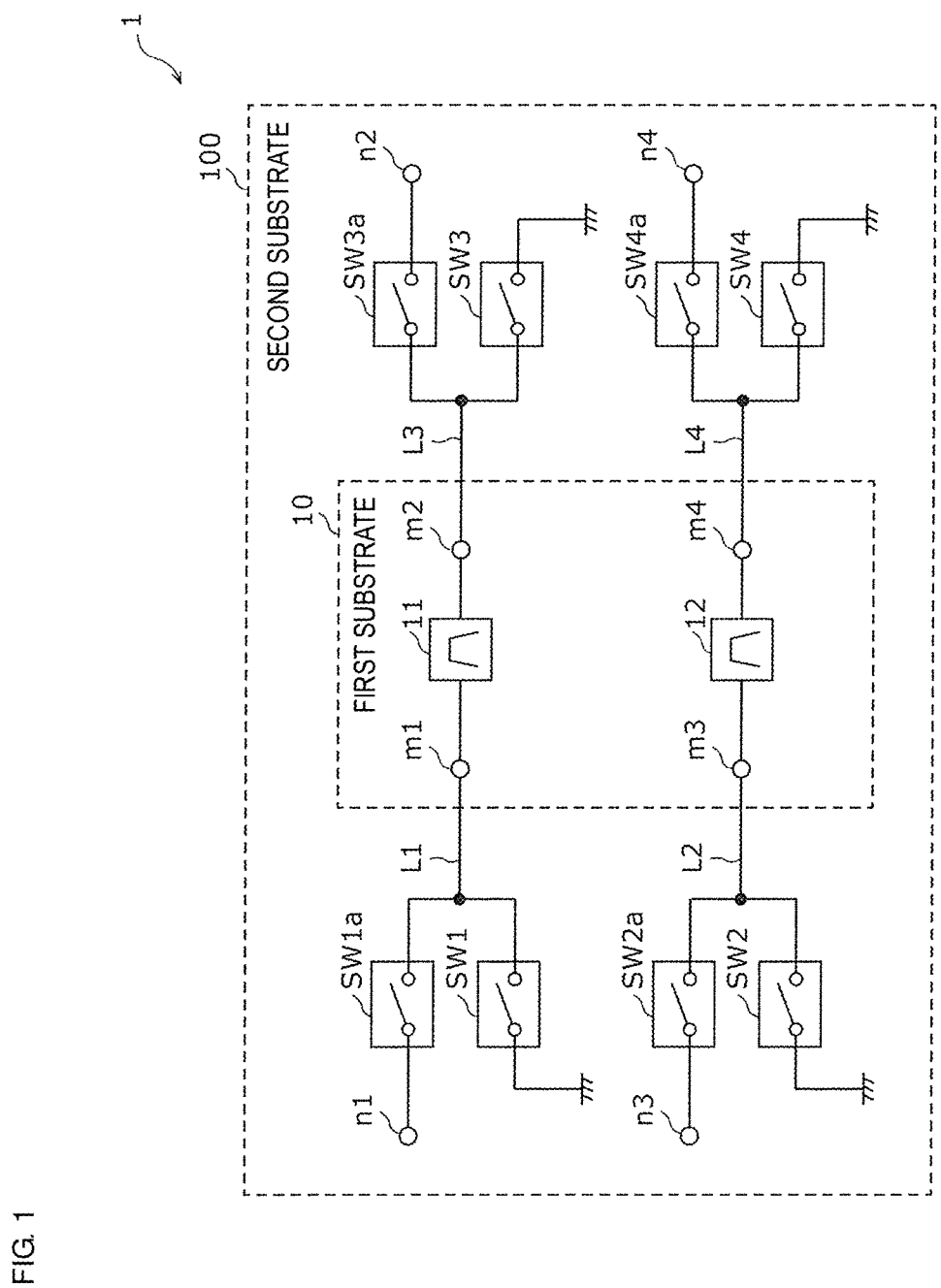
FIG. 1 is a diagram showing an example of a filter module according to Preferred Embodiment 1 of the present invention.

Hereinafter, preferred embodiments of the present invention will be described in detail with reference to the accompanying drawings. The preferred embodiments described below all represent inclusive or specific examples. The numerical values, shapes, materials, elements, arrangement and connection configurations of the elements, and the like described in the following preferred embodiments are merely examples and are not intended to limit the present invention. Among the elements in the following preferred embodiments, elements that are not described in the independent claims are described as optional elements. In the drawings, the same reference numerals are given to substantially the same features, elements, and components, and redundant description may be omitted or simplified in some cases. In addition, in the following preferred embodiments, the term "connected" includes not only a case of being directly connected, but also a case of being electrically connected via another element or the like.

Preferred Embodiment 1

1. Configuration of Filter Module

First, a filter module according to Preferred Embodiment 1 of the present invention will be described with reference to FIG. 1.

FIG. 1 is a diagram showing an example of a filter module 1 according to Preferred Embodiment 1.

The filter module 1 is a module supporting multiple bands, and supports, for example, two frequency bands. By operating the filter module 1, for example, time-division communication of signals in two frequency bands is performed. The filter module 1 includes input/output terminals n1 to n4. For example, an antenna element is connected to the input/output terminals n1 and n3, and input terminals of an amplification circuit, for example, a low-noise amplifier, are connected to the input/output terminals n2 and n4.

The filter module 1 includes a second substrate 100, a first substrate 10, switches SW1, SW1a, SW2, SW2a, SW3, SW3a, SW4, and SW4a, wires L1, L2, L3, and L4 that are provided in or on the second substrate 100.

The second substrate 100 is a mounting substrate in or on which the above-described components and other substrates, for example, the first substrate 10, are mounted, and is, for example, a printed substrate or the like. The input/output terminals n1 to n4 are provided, for example, in or on the second substrate 100. The first substrate 10 and the respective switches are connected by the wires L1, L2, L3, and L4 provided in or on the second substrate 100.

The first substrate 10 is provided with an input/output terminal m1 (first input/output terminal), an input/output terminal m2 (second input/output terminal), a filter 11, an input/output terminal m3 (third input/output terminal), an input/output terminal m4 (fourth input/output terminal), and a filter 12. That is, these elements are collectively provided in or on the first substrate 10. The first substrate 10 is preferably, for example, a printed substrate, a low temperature co-fired ceramics (LTCC) substrate, or the like. Although not shown in FIG. 1, at least one ground terminal connected to the filters 11 and 12 is provided in or on the first substrate 10 (see FIG. 4 described later). The input/output terminals m1 to m4 and the ground terminals are, for example, bumps or surface electrodes (pads) provided on the first substrate 10.

The filter 11 is a first filter provided on a path connecting the input/output terminal m1 and the input/output terminal m2. For example, the filter 11 is a reception filter, and of which pass band is Band25Rx (about 1930 MHz-about 1995 MHz) of Long Term Evolution (LTE).

The filter 12 is a second filter provided on a path connecting the input/output terminal m3 and the input/output terminal m4. For example, the filter 12 is a reception filter, and of which pass band is Band3Rx (about 1805 MHz-about 1880 MHz) of LTE.

The filters 11 and 12 are, for example, acoustic wave filters, and a resonator defining the acoustic wave filter is a resonator using, for example, a surface acoustic wave (SAW). A resonator using a boundary wave, a resonator, for example, a film bulk acoustic resonator (FBAR) using a bulk acoustic wave (BAW), or the like, is acceptable. The SAW resonator includes an interdigital transducer (IDT) electrode provided on a substrate with piezoelectricity, and a small-sized and low-profile filter circuit having a bandpass characteristic with high steepness is able to be provided. The substrate with piezoelectricity is a substrate having piezoelectricity at least at the surface thereof. For example, the substrate may include a multilayer body of a piezoelectric thin film on the surface thereof, a film of which the acoustic velocity is different from that of the piezoelectric thin film, a supporting substrate, and the like. Further, the substrate, for example, may be a multilayer body including a high acoustic velocity supporting substrate and a piezoelectric thin film provided on the high acoustic velocity supporting substrate, or may be a multilayer body including a high acoustic velocity supporting substrate, a low acoustic velocity film provided on the high acoustic velocity supporting substrate, and a piezoelectric thin film provided on the low acoustic velocity film. Alternatively, the substrate may be a multilayer body including a supporting substrate, a high acoustic velocity film provided on the supporting substrate, a low acoustic velocity film provided on the high acoustic velocity film, and a piezoelectric thin film provided on the low acoustic velocity film. The substrate may have piezoelectricity over the entire substrate.

The wire L1 is a first wire that is connected to the input/output terminal m1 and through which a signal that passes through the filter 11 is propagated. The wire L1 connects the input/output terminal m1 and the switch SW1. The wire L1 is also a wire that connects the input/output terminal m1 and the switch SW1a. The wire L2 is a second wire that is connected to the input/output terminal m3 and through which a signal that passes through the filter 12 is propagated. The wire L2 connects the input/output terminal m3 and the switch SW2. The wire L2 is also a wire that connects the input/output terminal m3 and the switch SW2a. The wire L3 is a third wire that is connected to the input/output terminal m2 and through which a signal that passes through the filter 11 is propagated. The wire L3 connects the input/output terminal m2 and the switch SW3. The wire L3 is also a wire that connects the input/output terminal m2 and the switch SW3a. The wire L4 is a fourth wire that is connected to the input/output terminal m4 and through which a signal that passes through the filter 12 is propagated. The wire L4 connects the input/output terminal m4 and the switch SW4. The wire L4 is also a wire that connects the input/output terminal m4 and the switch SW4a.

The switch SW1 is a first switch that switches between electrical connection and electrical disconnection between the wire L1 (input/output terminal m1) and the ground. For example, the switch SW1 is preferably a SPST switch, and the filter module 1 further includes a SPST switch SW1a that switches between electrical connection and electrical disconnection between the wire L1 (input/output terminal m1) and the input/output terminal n1 of a signal that passes through the filter 11. A SPDT switch may be provided instead of the SPST switches SW1 and SW1a. In this case, the first switch is a SPDT switch, the wire L1 (input/output terminal m1) is connected to a common terminal of the first switch, the input/output terminal n1 is connected to one of two selection terminals of the first switch, and the ground is connected to the other of the two selection terminal. In this case, the wire connecting the common terminal of the switch and the input/output terminal m1 defines and functions as the first wire.

The switch SW2 is a second switch that switches between electrical connection and electrical disconnection between the wire L2 (input/output terminal m3) and the ground. For example, the switch SW2 is preferably a SPST switch, and in this case, the filter module 1 further includes a SPST switch SW2a that switches between electrical connection and electrical disconnection between the wire L2 (input/output terminal m3) and the input/output terminal n3 of a signal that passes through the filter 12. A SPDT switch may be provided instead of the SPST switches SW2 and SW2a. In this case, the second switch is a SPDT switch, the wire L2 (input/output terminal m3) is connected to a common terminal of the second switch, the input/output terminal n3 is connected to one of two selection terminals of the second switch, and the ground is connected to the other of the two selection terminals. Further in this case, the wire connecting the common terminal of the switch and the input/output terminal m3 defines and functions as the second wire.

The switch SW3 is a third switch that switches between electrical connection and electrical disconnection between the wire L3 (input/output terminal m2) and the ground. For example, the switch SW3 is preferably a SPST switch, and in this case, the filter module 1 further includes a SPST switch SW3a that switches between electrical connection and electrical disconnection between the wire L3 (input/output terminal m2) and the input/output terminal n2 of a signal that passes through the filter 11. A SPDT switch may be provided instead of the SPST switches SW3 and SW3a. In this case, the third switch is a SPDT switch, the wire L3 (input/output terminal m2) is connected to a common terminal of the third switch, the input/output terminal n2 is connected to one of two selection terminals of the third switch, and the ground is connected to the other of the two selection terminals. Further in this case, the wire connecting the common terminal of the switch and the input/output terminal m2 defines and functions as the third wire.

The switch SW4 is a fourth switch that switches between electrical connection and electrical disconnection between the wire L4 (input/output terminal m4) and the ground. For example, the switch SW4 is preferably a SPST switch, and in this case, the filter module 1 further includes a SPST switch SW4a that switches between electrical connection and electrical disconnection between the wire L4 (input/output terminal m4) and the input/output terminal n4 of a signal that passes through the filter 12. A SPDT switch may be provided instead of the SPST switches SW4 and SW4a. In this case, the fourth switch is a SPDT switch, the wire L4 (input/output terminal m4) is connected to a common terminal of the fourth switch, the input/output terminal n4 is connected to one of two selection terminals of the fourth switch, and the ground is connected to the other of the two selection terminals. Further in this case, the wire connecting the common terminal of the switch and the input/output terminal m4 defines and functions as the fourth wire.

These switches are preferably, for example, a field effect transistor (FET) switch which includes GaAs or a complementary metal oxide semiconductor (CMOS), a diode switch, or the like.

In addition, these switches are switched, for example, based on a control signal from an external circuit (for example, RF signal processing circuit). In the case of the SPST switch, the electrically connected and electrically disconnected states are switched, and in the case of the SPDT switch, the connection between the common terminal and any of the plurality of selection terminals is switched. These switches are synchronously controlled based on a control signal from one RF signal processing circuit, for example.

Specifically, when the wire L1 (input/output terminal m1) and the ground are electrically connected by the switch SW1 and the wire L3 (input/output terminal m2) and the ground are electrically connected by the switch SW3, the wire L2 (input/output terminal m3) and the ground are electrically disconnected by the switch SW2 and the wire L4 (input/output terminal m4) and the ground are electrically disconnected by the switch SW4. At this time, the wire L1 (input/output terminal m1) and the input/output terminal n1 are electrically disconnected by the switch SW1a, the wire L3 (input/output terminal m2) and the input/output terminal n2 are electrically disconnected by the switch SW3a, the wire L2 (input/output terminal m3) and the input/output terminal n3 are electrically connected by the switch SW2a, and the wire L4 (input/output terminal m4) and the input/output terminal n4 are electrically connected by the switch SW4a.

Further, when the wire L2 (input/output terminal m3) and the ground are electrically connected by the switch SW2 and the wire L4 (input/output terminal m4) and the ground are electrically connected by the switch SW4, the wire L1 (input/output terminal m1) and the ground are electrically disconnected by the switch SW1 and the wire L3 (input/output terminal m2) and the ground are electrically disconnected by the switch SW3. At this time, the wire L2 (input/output terminal m3) and the input/output terminal n3 are electrically disconnected by the switch SW2a, the wire L4 (input/output terminal m4) and the input/output terminal n4 are electrically disconnected by the switch SW4a, the wire L1 (input/output terminal m1) and the input/output terminal n1 are electrically connected by the switch SW1a, and the wire L3 (input/output terminal m2) and the input/output terminal n2 are electrically connected by the switch SW3a.

That is, when the communication in a frequency band (for example, Band25Rx) corresponding to the pass band of the filter 11 is performed, the wires L1 and L3 and the input/output terminals m1 and m2 connected to the wires L1 and L3 are electrically disconnected from the ground, and the wires L2 and L4 and the input/output terminals m3 and m4 connected to the wires L2 and L4 are electrically connected to the ground. When the communication in a frequency band (for example, Band3Rx) corresponding to the pass band of the filter 12 is performed, the wires L2 and L4 and the input/output terminals m3 and m4 connected to the wires L2 and L4 are electrically disconnected from the ground, and the wires L1 and L3 and the input/output terminals m1 and m2 connected to the wires L1 and L3 are electrically connected to the ground.

These switches may be provided in the second substrate 100, or may be provided on the second substrate 100. Further, the filter module 1 may not include the second substrate 100, and each of the switches SW1, SW1a, SW2, SW2a, SW3, SW3a, SW4, and SW4a, and each of the wires L1, L2, L3, and L4 may be provided to a separate body.

2. Configurations of First Filter and Second Filter

Next, the filters 11 and 12 will be described with reference to FIG. 2 and FIG. 3.

Figure 2:
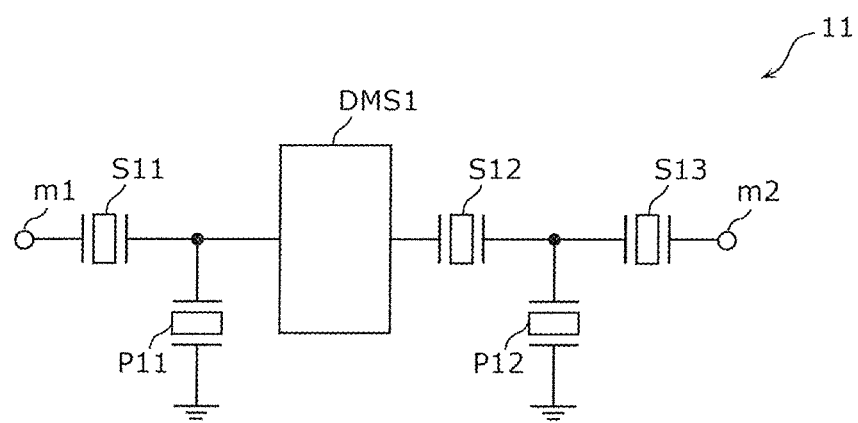
FIG. 2 is a diagram showing an example of a first filter according to Preferred Embodiment 1 of the present invention.

FIG. 2 is a diagram showing an example of the filter 11 (first filter) according to Preferred Embodiment 1. FIG. 2 also shows the input/output terminals m1 and m2 in addition to the filter 11.

The filter 11 includes series arm resonators S11 to S13 and a double-mode SAW filter DMS1 provided on a path connecting the input/output terminal m1 and the input/output terminal m2, and parallel arm resonators P11 and P12. The parallel arm resonators P11 and P12 are respectively provided between different connection nodes, which are provided on the path, and the ground. The connection node refers to a connection point between elements or between an element and a terminal. The parallel arm resonator P11 is connected between the connection node, which is between the series arm resonator S11 and the double-mode SAW filter DMS1, and the ground. The parallel arm resonator P12 is connected between the connection node, which is between a series arm resonator S12 and the series arm resonator S13, and the ground. Accordingly, the pass band (for example, Band25Rx) of the filter 11 is provided.

Figure 3:
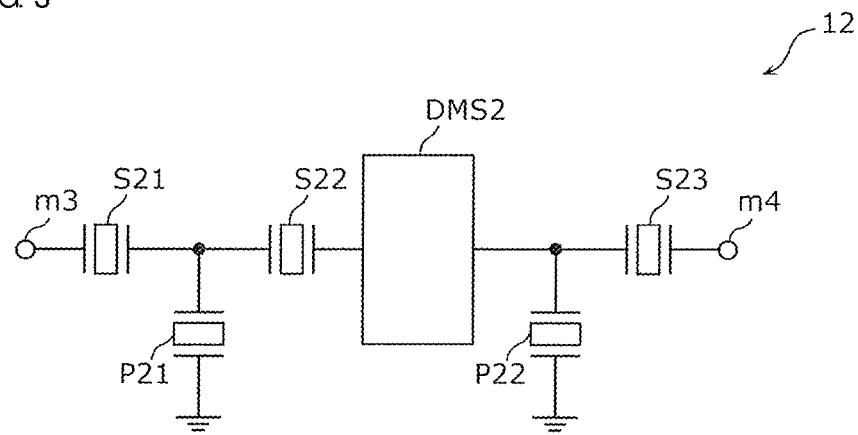
FIG. 3 is a diagram showing an example of a second filter according to Preferred Embodiment 1 of the present invention.

FIG. 3 is a diagram showing an example of the filter 12 (second filter) according to Preferred Embodiment 1. FIG. 3 also shows the input/output terminals m3 and m4 in addition to the filter 12.

The filter 12 includes series arm resonators S21 to S23 and a double-mode SAW filter DMS2 provided on a path connecting the input/output terminal m3 and the input/output terminal m4, and parallel arm resonators P21 and P22. The parallel arm resonators P21 and P22 are respectively provided between different connection nodes, which are provided on the path, and the ground. The parallel arm resonator P21 is connected between the connection node, which is between the series arm resonator S21 and a series arm resonator S22, and the ground. The parallel arm resonator P22 is connected between the connection node, which is between the double-mode SAW filter DMS2 and the series arm resonator S23, and the ground. Accordingly, the pass band (for example, Band3Rx) of the filter 12 is provided.

The number of resonators defining the filters 11 and 12, whether the double-mode SAW filter is present, and the like are merely examples, and preferred embodiments of the present invention are not limited to the example described here.

3. Layout of First Substrate and Wiring Example of Wires Connected to First Substrate Next, a layout of the first substrate 10 and a wiring example of wires connected to the first substrate 10 will be described with reference to FIG. 4 and FIG. 5.

First, the layout of the first substrate 10 will be described with reference to FIG. 4.

Figure 4:
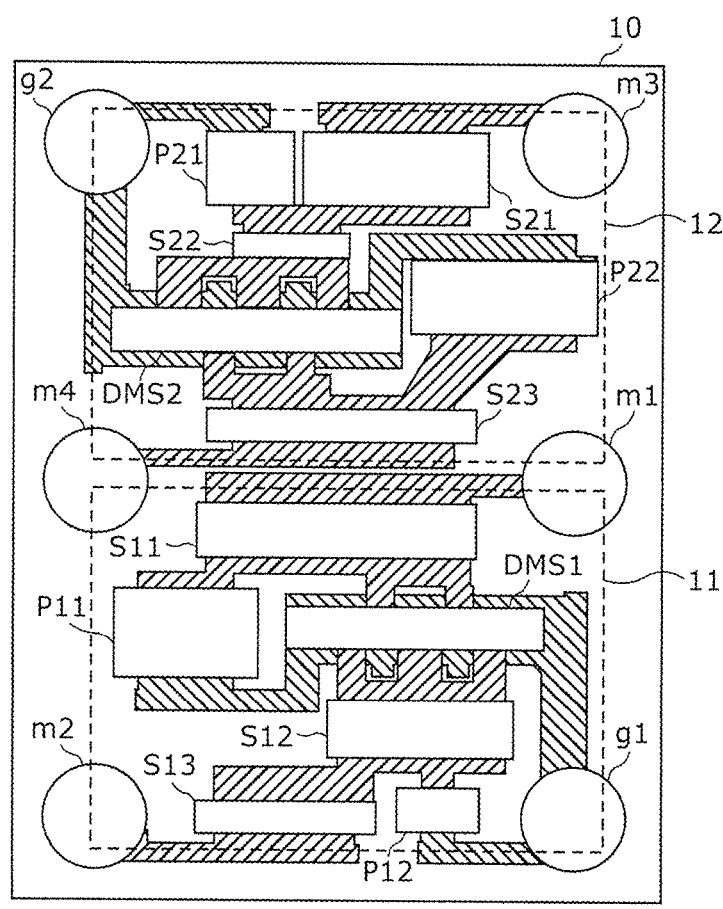
FIG. 4 is a plan view showing an example of a layout of a first substrate according to Preferred Embodiment 1 of the present invention.

FIG. 4 is a plan view showing a layout example of the first substrate 10 according to Preferred Embodiment 1. In FIG. 4, the wires connecting a terminal and a component and the wires connecting components are hatched. Specifically, ground lines connected to the ground are hatched by parallel lines extending from upper left to lower right, and signal lines in which a high frequency signal passes through are hatched by parallel lines extending from upper right to lower left. Further in FIG. 4, the signal lines and the ground lines appear to be in contact with each other and electrically connected to each other adjacent to or in a vicinity of the double-mode SAW filters DMS1 and DMS2. However, for example, under one wire (signal line, here), the other wire (ground line, here) is provided with the wires not electrically connected to each other.

As shown in FIG. 4, the filters 11 and 12, and the input/output terminals m1 to m4 are collectively provided in or on the first substrate 10. In addition, at least one ground terminal connected to the filter 11 and the filter 12 is provided in or on the first substrate 10. For example, the first substrate 10 is provided with a ground terminal g1 connected to the filter 11 (specifically, parallel arm resonators P11 and P12 and double-mode SAW filter DMS1), and a ground terminal g2 connected to the filter (specifically, parallel arm resonators P21 and P22 and double-mode SAW filter DMS2).

In order to reduce the size of the first substrate 10, the components, for example, the filters 11 and 12, the input/output terminals m1 to m4, and the ground terminals g1 and g2 connected thereto, are densely provided. Therefore, the input/output terminal m1 (here, for example, input terminal) connected to the filter 11 and the input/output terminal m3 (here, for example, input terminal) connected to the filter 12 are provided adjacent to or in a vicinity of one another. Further, the input/output terminal m2 (here, for example, output terminal) connected to the filter 11 and the input/output terminal m4 (here, for example, output terminal) connected to the filter 12 are provided adjacent to or in a vicinity of one another. For example, the input/output terminal m1 and the input/output terminal m3 are adjacent to each other without at least any one ground terminal placed in between, and the input/output terminal m2 and the input/output terminal m4 are adjacent to each other without at least any one ground terminal placed in between.

Next, a wiring example of wires connected to the first substrate 10 will be described with reference to FIG. 5.

Figure 5:
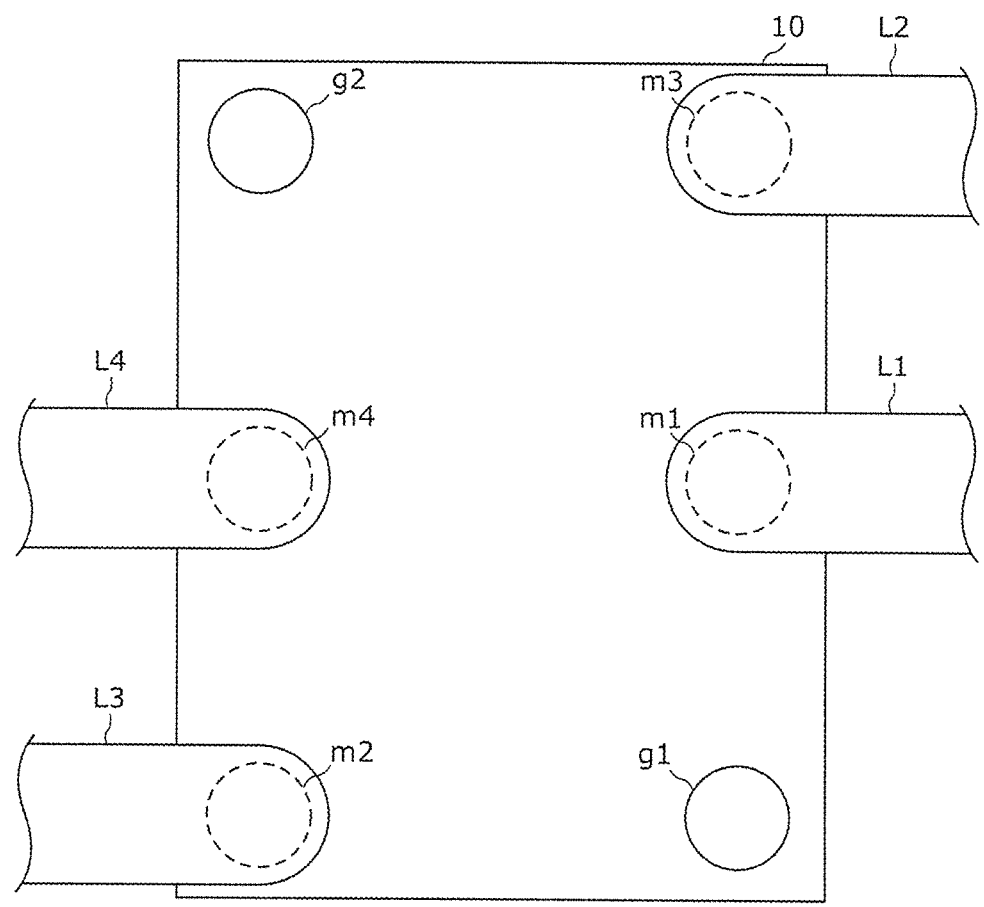
FIG. 5 is a plan view showing an example of a wire connected to the first substrate according to Preferred Embodiment 1 of the present invention.

FIG. 5 is a plan view showing an example of wires connected to the first substrate 10 according to Preferred Embodiment 1. In FIG. 5, the components and wires provided with the first substrate 10 are not shown, and only the terminals are shown with respect to the first substrate 10.

As shown in FIG. 5, since the input/output terminal m1 and the input/output terminal m3 are provided adjacent to or in a vicinity of one another in or on the first substrate 10, the wires L1 and L2 connected thereto are also provided adjacent to or in a vicinity of one another. Similarly, since the input/output terminal m2 and the input/output terminal m4 are provided adjacent to or in a vicinity of one another in or on the first substrate 10, the wires L3 and L4 connected thereto are also provided adjacent to or in a vicinity of one another. As a result, the isolation between the wires L1 and L2 and sufficient isolation between the wires L3 and L4 may not be provided.

4. Filter Characteristic

Next, the bandpass characteristic of the filter 11, when the communication in the frequency band (Band25Rx, for example) corresponding to the pass band of the filter 11 is performed and the communication in the frequency band (Band3Rx, for example) corresponding to the pass band of the filter 12 is not performed, will be described with reference to FIGS. 6A and 6B.

Figure 6A:
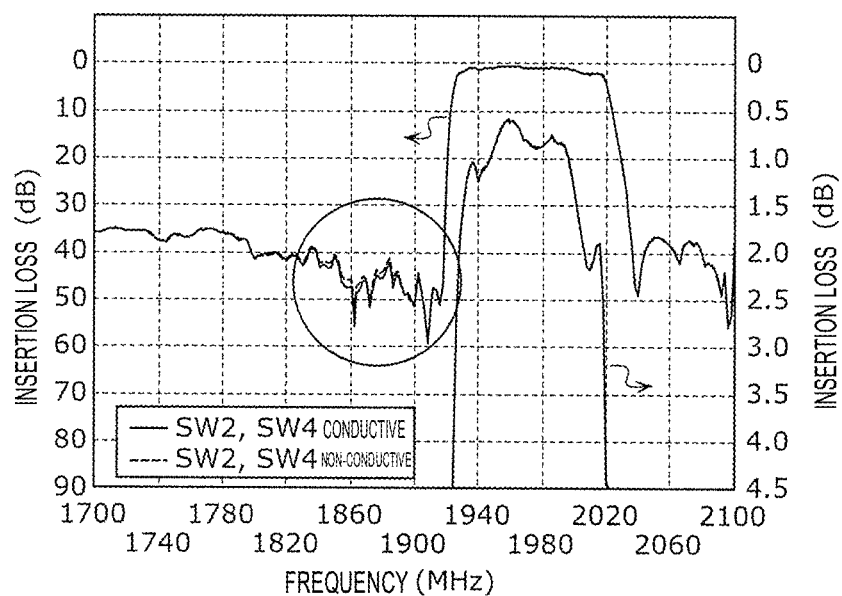
FIG. 6A is a line graph showing a bandpass characteristic of the first filter according to Preferred Embodiment 1 of the present invention when respective switches are in the first state and the second state.
Figure 6B:
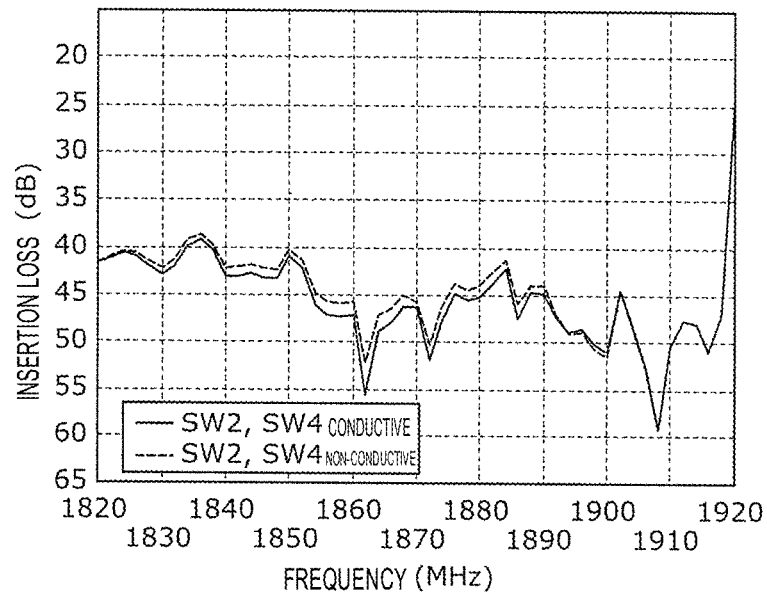
FIG. 6B is an enlarged view of a circled portion of FIG. 6A.

FIG. 6A is a graph showing the bandpass characteristic of the filter 11 (first filter) according to Preferred Embodiment 1 when the respective switches are in the first state and in the second state. FIG. 6B is an enlarged view of the circled portion of FIG. 6A.

The first state refers to a state in which the switches SW1$a$ and SW3$a$ are in a conductive state, the switches SW1 and SW3 are in a non-conductive state, the switches SW2$a$ and SW4$a$ are in a non-conductive state, and the switches SW2 and SW4 are in a conductive state. The second state refers to a state in which the switches SW2 and SW4 are in a non-conductive state with respect to the first state.

When the communication in the pass band of the filter 11 is performed and the communication in the pass band of the filter 12 is not performed, in both of the first state and the second state, the switches SW1$a$ and SW3$a$ are in a conductive state, the switches SW1 and SW3 are in a non-conductive state, and the switches SW2$a$ and SW4$a$ are in a non-conductive state. In the first state, further, the switches SW2 and SW4 are in a conductive state, and the wires L2 and L4 (input/output terminals m3 and m4) and the ground are electrically connected. In the second state, further, the switches SW2 and SW4 are in a non-conductive state, and the wires L2 and L4 (input/output terminals m3 and m4) and the ground are electrically disconnected. Although preferred embodiments of the present invention provide the respective switches in the first state, the problem that occurs when the respective switches are in the second state will be described first.

In the second state, the terminal and the wire with respect to the filter 12 are in a state of floating from the ground. At this time, since the wires L1 and L2 are provided adjacent to or in a vicinity of one another, a portion of the high frequency signal inputted to the input/output terminal m1 through the wire L1 may leak to the wire L2 in some cases. Further, since the wires L3 and L4 are provided adjacent to or in a vicinity of one another, a portion of the leakage signal that has passed through the filter 12 may return to the wire L3 in some cases.

As described above, the filter 12 has the pass band of Band3Rx (1805-1880 MHz), and Band3Rx is located in the attenuation band in the low-band side of Band25Rx (about 1930 MHz-about 1995 MHz) which is the pass band of the filter 11. That is, the high frequency signal inputted to the input/output terminal m1 through the wire L1 may be attenuated in the component of Band3Rx by the filter 11. However, when a portion of the high frequency signal leaks to the wire L2, the component of Band3Rx included in the leakage signal passes through the filter 12 of which pass band is Band3Rx. Then, when the leakage signal including the component of Band3Rx that has passed through the filter 12 returns to the wire L3 from the wire L4, as a result, the filter 11 may not attenuate a portion of the component of Band3Rx, and the attenuation characteristic is deteriorated. As shown in FIGS. 6A and 6B, in the vicinity of Band3Rx (about 1805 MHz-about 1880 MHz), the attenuation characteristic is deteriorated more in the second state than in the first state to be described later.

Therefore, in preferred embodiments of the present invention, respective switches are set to the first state, and the terminal and the wire with respect to the filter 12 are connected to the ground.

In the first state, the input/output terminals m3 and m4, and the wires L2 and L4 are in a state of being connected to the ground. Therefore, even when a portion of the high frequency signal inputted to the input/output terminal m1 through the wire L1 leaks to the wire L2, since the wire L2 and the input/output terminal m3 are connected to the ground, the leakage signal flows to the ground. Further, since the wire L4 and the input/output terminal m4 are connected to the ground, it is unlikely that the leakage signal returns to the wire L3 from the wire L4. Therefore, as shown in FIGS. 6A and 6B, in the vicinity of Band3Rx (about 1805 MHz-about 1880 MHz), the deterioration of attenuation characteristics is further significantly reduced or prevented in the first state than in the second state.

The bandpass characteristic of the filter 12, when the communication in the frequency band corresponding to the pass band of the filter 12 (Band3Rx, for example) is performed and the communication in the frequency band corresponding to the pass band of the filter 11 (Band25Rx, for example) is not performed, tends to be the same as or similar to the above description. Although the detailed description is omitted, the deterioration of attenuation characteristics of the filter 12 in the vicinity of Band25Rx (about 1930 MHz-about 1995 MHz) located in the high-band side of Band3Rx (about 1805 MHz-about 1880 MHz), which is the pass band of the filter 12, is able to be significantly reduced or prevented.

As shown in FIG. 4, the ground terminal is not provided with the first substrate 10 except for the ground terminals g1 and g2, but the deterioration of attenuation characteristics is able to be significantly reduced or prevented. The input/output terminals m1 to m4 may also be operated as the ground terminals and the number of the ground terminals is substantially increased. That is, since there is no need to increase the number of ground terminals, the deterioration of attenuation characteristics is able to be significantly reduced or prevented without increasing of the size.

Further, by provided the ground terminals between the input/output terminals m1 and m3 and between the input/output terminals m2 and m4, the isolation is able to be significantly increased (that is, significantly reducing or preventing the deterioration of attenuation characteristics). However, as shown in FIG. 4, the deterioration of attenuation characteristics is able to be significantly reduced or prevented without providing terminals at these specific locations. Similarly, even in a state in which the isolation between the wires L1 and L2 and between the wires L3 and L4 is insufficient (for example, a state in which the wires are in parallel or crossed with each other without the ground placed between the wires), the deterioration of attenuation characteristics is able to be significantly reduced or prevented. As described above, the isolation may be enhanced by operating the terminals and the wires of the filter of the side that is not used for the communication as the ground. Therefore, it is not necessary to provide a design to increase isolation aside from the above features, and a degree of freedom in design is able to be significantly increased.

5. Modification

The switches SW1 to SW4 may be provided in or on one chip.

Figure 7:
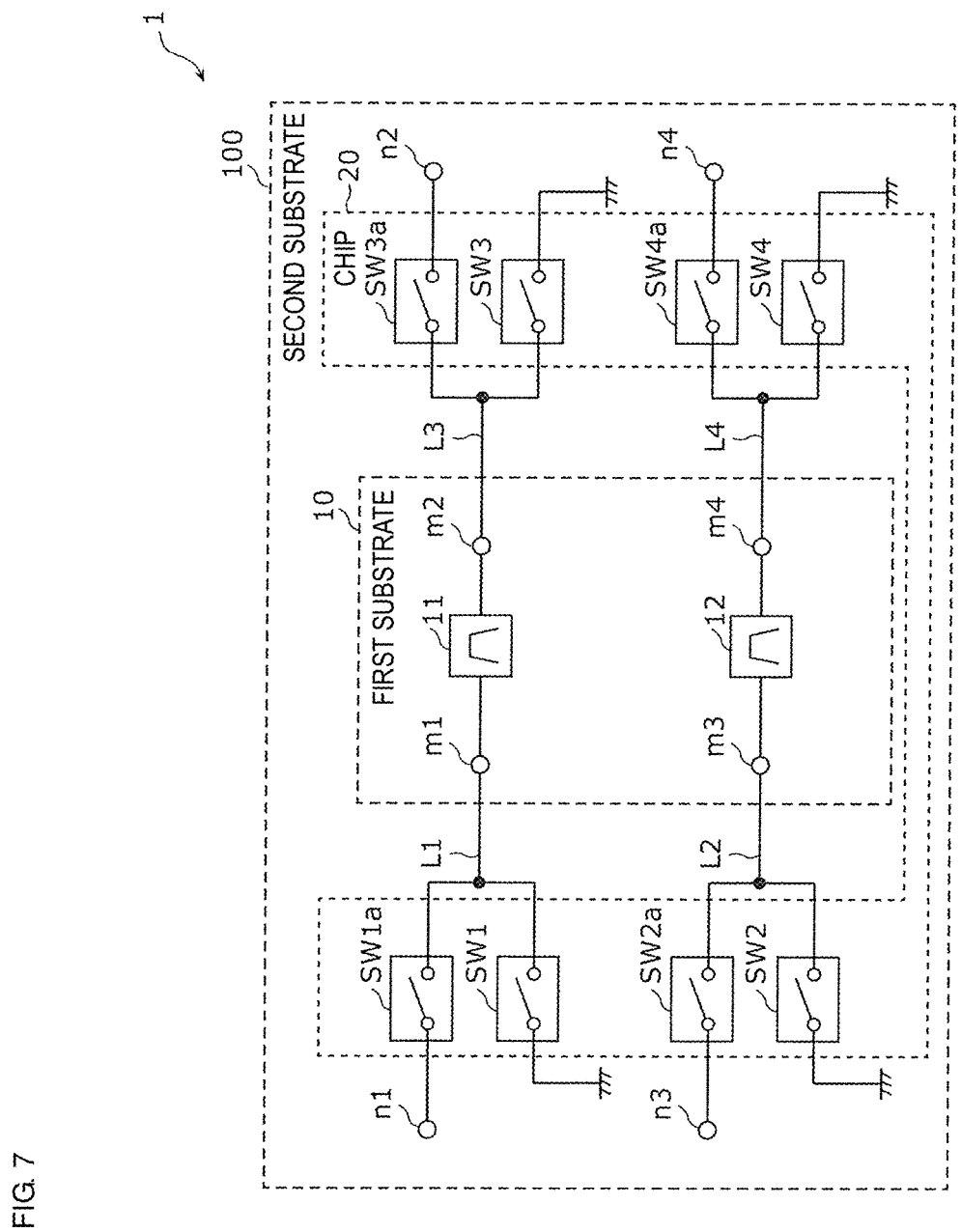
FIG. 7 is a diagram showing another example of the filter module according to Preferred Embodiment 1 of the present invention.

FIG. 7 is a diagram showing another example of the filter module 1 according to Preferred Embodiment 1. As shown in FIG. 7, the switches SW1, SW1a, SW2, SW2a, SW3, SW3a, SW4, and SW4a may be provided in or on one chip 20. Then, the chip 20 may be mounted on the second substrate 100.

6. Summary

As described above, for example, in a case where the pass band of the filter 11 is different from the pass band of the filter 12, when the communication in the pass band of the filter is performed and the communication in the pass band of the filter 12 is not performed, the wire L2 and the ground are electrically connected by the switch SW2, and the wire L4 and the ground are electrically connected by the switch SW4. That is, both of the wire connected to the input terminal of the filter 12 and the wire connected to the output terminal of the filter 12, not one of them, are electrically connected to the ground. Thus, the ground (input/output terminal m3, input/output terminal m4, wire L2, and wire L4) is provided adjacent to or in a vicinity of the input/output terminal m1, the input/output terminal m2, the wire L1, and the wire L3, and the deterioration of attenuation characteristics of the filter 11 is able to be significantly reduced or prevented. Similarly, for example, when the communication in the pass band of the filter 12 is performed and the communication in the pass band of the filter 11 is not performed, the wire L1 and the ground are electrically connected by the switch SW1 and the wire L3 and the ground are electrically connected by the switch SW3. That is, both of the wire connected to the input terminal of the filter 11 and the wire connected to the output terminal of the filter 11, not one of them, are electrically connected to the ground. Therefore, the ground (input/output terminal m1, input/output terminal m2, wire L1, and wire L3) is provided adjacent to or in a vicinity of the input/output terminal m3, the input/output terminal m4, the wire L2, and the wire L4, and the deterioration of attenuation characteristics of the filter 12 is able to be significantly reduced or prevented. Further, since the number of ground terminals is not increased and the input/output terminal for a high frequency signal connected to the respective filters may also be operated as the ground terminal, a significant reduction in size is able to be provided. As described above, the deterioration of attenuation characteristics is able to be significantly reduced or prevented while providing a significant reduction in size.

Preferred Embodiment 2

Next, a filter module according to Preferred Embodiment 2 of the present invention will be described with reference to FIG. 8.

Figure 8:
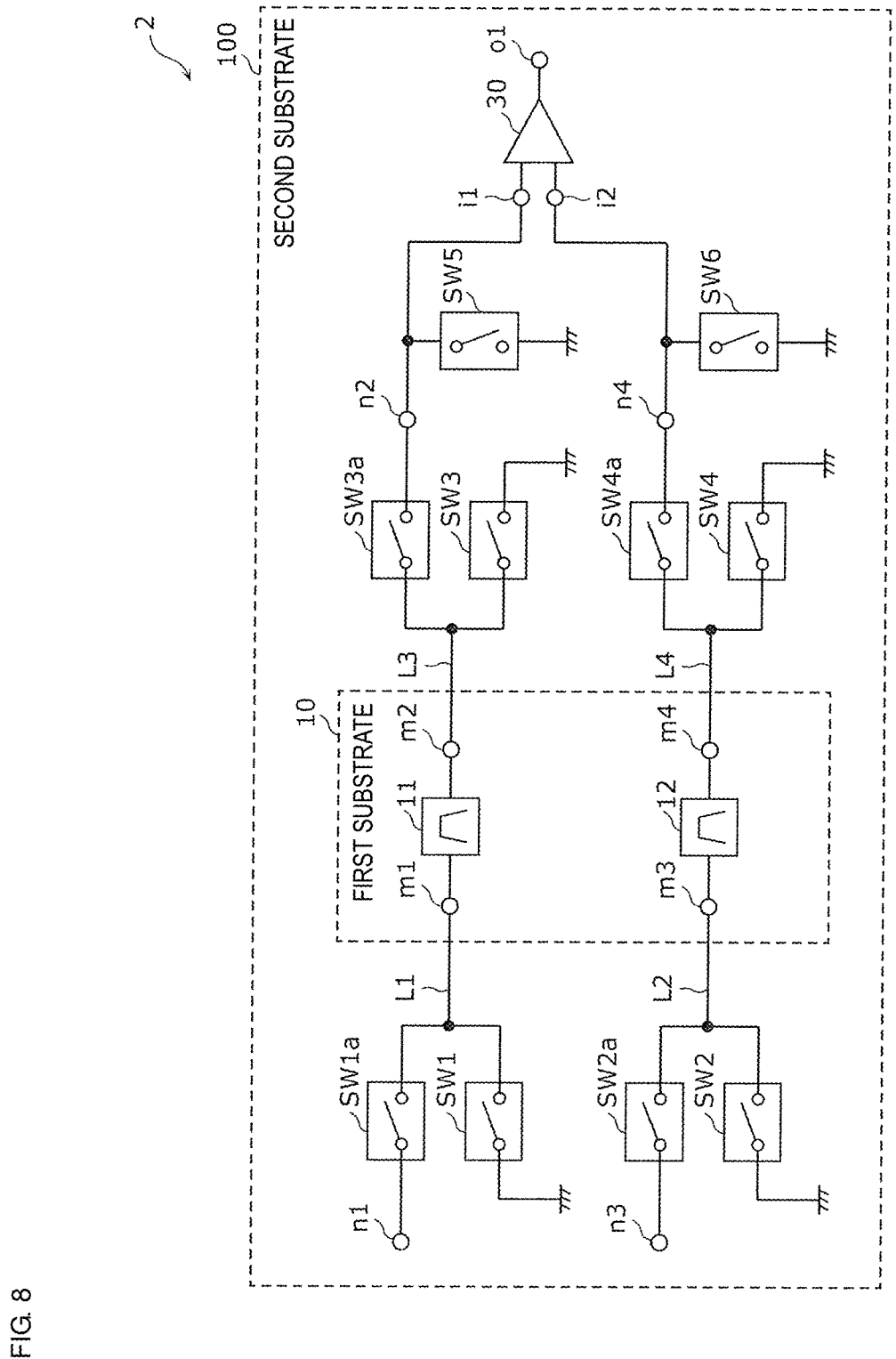
FIG. 8 is a diagram showing an example of a filter module according to Preferred Embodiment 2 of the present invention.

FIG. 8 is a diagram showing an example of a filter module 2 according to Preferred Embodiment 2.

The filter module 2 according to Preferred Embodiment 2 is different from the filter module 1 according to Preferred Embodiment 1 in that switches SW5, SW6, and an amplification circuit 30 are connected to the input/output terminals n2 and n4. Other points are the same as or similar to those of the filter module 1 according to Preferred Embodiment 1, and a description thereof will be omitted.

The amplification circuit 30 has an input terminal i1 (first input terminal) connected to the filter 11, an input terminal i2 (second input terminal) connected to the filter 12, and an output terminal o1. Specifically, the input terminal i1 is connected to the switch SW5 provided between a connection node and the ground, where the connection node is on a path connecting the input/output terminal m2 and the input terminal i1, and is connected to the filter 11 through the switch SW3a provided on the path. The input terminal i2 is connected to the switch SW6 provided between a connection node and the ground, where the connection node is on a path connecting the input/output terminal m4 and the input terminal i2, and is connected to the filter 12 through the switch SW4a provided on the path. The amplification circuit 30 is, for example, a low noise amplifier that amplifies either one of a signal inputted to the input terminal i1 that has passed through the filter 11 or a signal inputted to the input terminal i2 that has passed through the filter 12, and outputs the amplified signal from the output terminal o1. To the output terminal o1, the RF signal processing circuit or the like is connected, for example.

The switch SW5 is a fifth switch that switches between electrical connection and electrical disconnection between the input terminal i1 and the ground. The switch SW5 may be connected to the input terminal i1 directly, or may be connected through a wire. When the switch SW5 is connected to the input terminal i1 through the wire, the switch SW5 switches between electrical connection and electrical disconnection between the input terminal i1 and the ground by switching between electrical connection and electrical disconnection between the wire and the ground. The switch SW6 is a sixth switch that switches between electrical connection and electrical disconnection between the input terminal i2 and the ground. The switch SW6 may be connected to the input terminal i2 directly, or may be connected through a wire. When the switch SW6 is connected to the input terminal i2 through the wire, the switch SW6 switches between electrical connection and electrical disconnection between the input terminal i2 and the ground by switching between electrical connection and electrical disconnection between the wire and the ground. The switches SW5 and SW6 are preferably, for example, an FET switch which includes GaAs or CMOS, a diode switch, or the like. Further, the switches SW5 and SW6 are switched between electrically connected and electrically disconnected states based on a control signal from an external circuit (for example, RF signal processing circuit), for example. Furthermore, the switches SW5 and SW6 are synchronously controlled, with the above-described switches SW1, SW1a, SW2, SW2a, SW3, SW3a, SW4 and SW4a, based on a control signal from one RF signal processing circuit, for example.

Specifically, when the wire L1 (input/output terminal m1) and the ground are electrically connected by the switch SW1, the input terminal i1 and the ground are electrically connected by the switch SW5, and the input terminal i2 and the ground are electrically disconnected by the switch SW6. When the wire L1 (input/output terminal m1) and the ground are electrically connected by the switch SW1, the switches SW3, SW2a, and SW4a are also conductive, and the switches SW1a, SW3a, SW2, and SW4 are non-conductive.

Further, when the wire L2 (input/output terminal m3) and the ground are electrically connected by the switch SW2, the input terminal i1 and the ground are electrically disconnected by the switch SW5, and the input terminal i2 and the ground are electrically connected by the switch SW 6. When the wire L2 (input/output terminal m3) and the ground are electrically connected by the switch SW2, the switches SW4, SW1a, and SW3a also are conductive, and the switches SW2a, SW4a, SW1, and SW3 are non-conductive.

That is, when the communication in the frequency band corresponding to the pass band of the filter 11 is performed, the input terminal i1, to which the high frequency signal passing through the filter 11 is inputted, and the ground are electrically disconnected, and the input terminal i2, to which a high frequency signal is not inputted as the communication is not performed, is electrically connected to the ground. Further, when the communication in the frequency band corresponding to the pass band of the filter 12 is performed, the input terminal i2, to which the high frequency signal passing through the filter 12 is inputted, and the ground are electrically disconnected, and the input terminal i1, to which a high frequency signal is not inputted as the communication is not performed, is electrically connected to the ground.

The filter module 2 may not include the second substrate 100, and each of the switches SW1, SW1a, SW2, SW2a, SW3, SW3a, SW4, SW4a, SW5, and SW6, the amplification circuit 30, and each of the wires L1, L2, L3, and L4 may be provided to a separate body.

Further, the switches SW1 to SW6 and the amplification circuit 30 may be provided in or on one chip.

Figure 9:
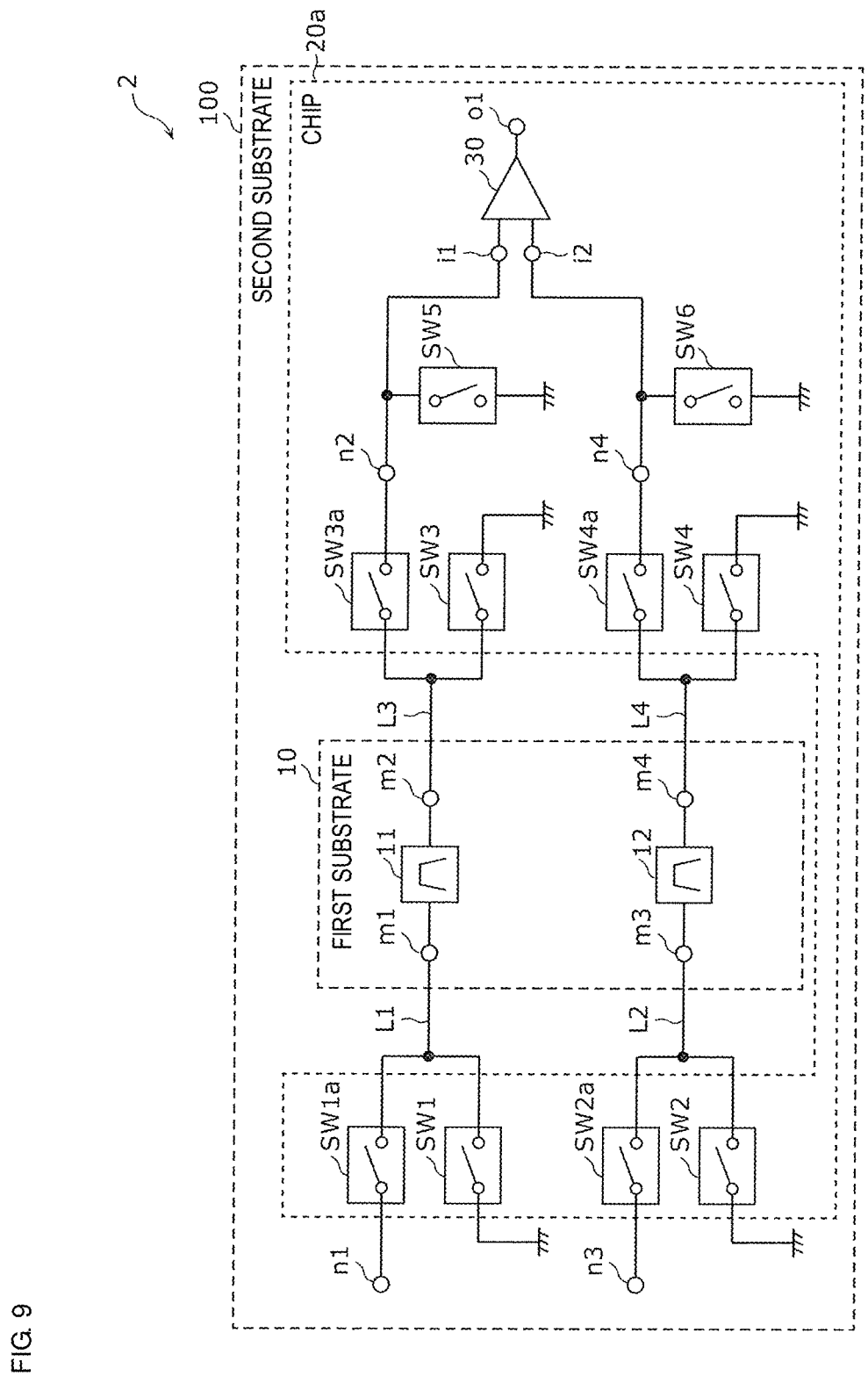
FIG. 9 is a diagram showing another example of the filter module according to Preferred Embodiment 2 of the present invention.

FIG. 9 is a diagram showing another example of the filter module 2 according to Preferred Embodiment 2. As shown in FIG. 9, the switches SW1, SW1a, SW2, SW2a, SW3, SW3a, SW4, SW4a, SW5, and SW6, and the amplification circuit 30 may be provided in or on one chip 20a. Then, the chip 20a may be mounted on the second substrate 100.

As described above, for example, in a case where the switch SW6 is in a non-conductive state while the communication in the frequency band corresponding to the pass band of the filter 11 is performed, when the signal leaks from the switch SW4a that is in a non-conductive state and is inputted to the input terminal i2, the amplification circuit 30 may malfunction due to the signal inputted to the input terminal i2 instead that the amplification circuit 30 amplifies only the signal inputted to the input terminal i1. Then, the switch SW6 is brought into a conductive state to connect the input terminal i2 to the ground. Thus, the signal is not inputted to the input terminal i2, and malfunctioning of the amplification circuit 30 is able to be significantly reduced or prevented. As described above, since the input terminal of the amplification circuit 30 on the side that is not used for the communication and the ground are electrically connected, malfunctioning of the amplification circuit 30 is able to be significantly reduced or prevented.

Preferred Embodiment 3

Next, a filter module according to Preferred Embodiment 3 of the present invention will be described with reference to FIG. 10.

Figure 10:
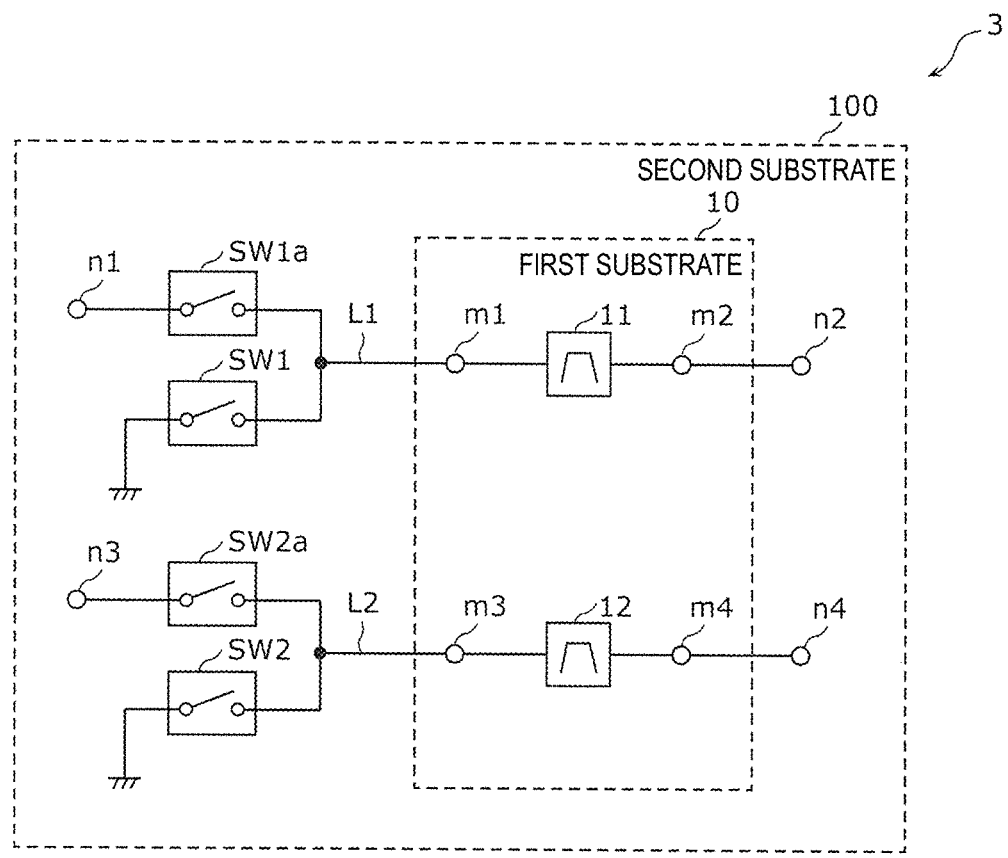
FIG. 10 is a diagram showing an example of a filter module according to Preferred Embodiment 3 of the present invention.

FIG. 10 is a diagram showing an example of a filter module 3 according to Preferred Embodiment 3.

The filter module 3 according to Preferred Embodiment 3 differs from the filter module 1 according to Preferred Embodiment 1 in that the switches SW3 and SW4, and the like are not connected to the input/output terminals m2 and m4. Other points are the same as or similar to those of the filter module 1 according to Preferred Embodiment 1, and a description thereof will be omitted.

In Preferred Embodiment 1, of the filters 11 and 12, both of the input terminal and the output terminal of the filter, which are not used for the communication, are electrically connected to the ground, but only either one of the input terminal or the output terminal may be electrically connected to the ground. Therefore, as in the filter module 3 shown in FIG. 10, the switches SW3 and SW3a may not be connected to the input/output terminal m2, and the switches SW4 and SW4a may not be connected to the input/output terminal m4.

The filter module 3 may not include the second substrate 100, and each of the switches SW1, SW1a, SW2, and SW2a, and each of the wires L1 and L2 may be provided to a separate body.

Although not shown, the switches SW1 and SW2 may be provided in or on one chip.

As described above, when the communication in the pass band of the filter 11 is performed and the communication in the pass band of the filter 12 is not performed, the wire L2 (input/output terminal m3) and the ground are electrically connected by the switch SW2. That is, the wire L2 and the input/output terminal m3 connected to the wire L2 have the ground electrical potential. Therefore, the ground (input/output terminal m3 and wire L2) is provided adjacent to or in a vicinity of the input/output terminal m1 and the wire L1, and the deterioration of attenuation characteristics of the filter 11 is able to be significantly reduced or prevented. Similarly, for example, when the communication in the pass band of the filter 12 is performed and the communication in the pass band of the filter 11 is not performed, the wire L1 (input/output terminal m1) and the ground are electrically connected by the switch SW1. That is, the wire L1 and the input/output terminal m1 connected to the wire L1 have the ground electrical potential. With this, the ground (input/output terminal m1 and wire L1) is provided adjacent to or in a vicinity of the input/output terminal m3 and the wire L2, and the deterioration of attenuation characteristics of the filter 12 is able to be significantly reduced or prevented. Further, since the number of ground terminals is not increased and the input/output terminal for a high frequency signal connected to the respective filters may also be operated as the ground terminal, a significant reduction in size is able to be provided. As described above, the deterioration of attenuation characteristics is able to be significantly reduced or prevented while providing a significant reduction in size.

Other Preferred Embodiments

Filter modules according to the present invention has been described with reference to the preferred embodiments, but the present invention is not limited to the above-described preferred embodiments. Other preferred embodiments provided by combining any appropriate components in the above-described preferred embodiments, modification examples provided by applying various modifications that a person skilled in the art conceives without a range departing from the gist of the present invention with respect to the above preferred embodiments, and various devices with the filter module according to the present invention built in are also included in the present invention.

For example, in the above-described preferred embodiments, the filter module includes two filters 11 and 12, but may include three or more filters.

Further, for example, although in the above-described preferred embodiment, the input/output terminal m1 and the input/output terminal m3 are adjacent to each other without at least any one ground terminal placed in between, and the input/output terminal m2 and the input/output terminal m4 are adjacent to each other without at least any one ground terminal placed in between, the present invention is not limited thereto. For example, the input/output terminal m1 and the input/output terminal m3 may be adjacent to each other with at least any one ground terminal placed in between, and the input/output terminal m2 and the input/output terminal m4 may be adjacent to each other with at least any one ground terminal placed in between.

Further, for example, in the preferred embodiments described above, the pass band of the filter 11 is Band25Rx (about 1930 MHz-about 1995 MHz), and the pass band of the filter 12 is Band3Rx (about 1805 MHz-about 1880 MHz), however, the present invention is not limited thereto, and other frequency bands may be used. Also, these pass bands may be the same or substantially the same.

The present invention may widely be included in a communication device, for example, a mobile phone, as a filter module applicable to a multiband system.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter module comprising:
  a first input/output terminal;
  a second input/output terminal;
  a first filter provided on a path connecting the first input/output terminal and the second input/output terminal;
  a third input/output terminal;
  a fourth input/output terminal;
  a second filter provided on a path connecting the third input/output terminal and the fourth input/output terminal;
  a first substrate in or on which the first input/output terminal, the second input/output terminal, the first filter, the third input/output terminal, the fourth input/output terminal, and the second filter are provided;
  a first wire connected to the first input/output terminal and through which a signal passing through the first filter is propagated;
  a first switch that switches between electrical connection and electrical disconnection between the first wire and the ground;
  a second wire connected to the third input/output terminal and through which a signal passing through the second filter is propagated;
  a second switch that switches between electrical connection and electrical disconnection between the second wire and the ground;
  a third wire connected to the second input/output terminal and through which a signal passing through the first filter is propagated;
  a third switch that switches between electrical connection and electrical disconnection between the third wire and the ground;
  a fourth wire connected to the fourth input/output terminal and through which a signal passing through the second filter is propagated; and
  a fourth switch that switches between electrical connection and electrical disconnection between the fourth wire and the ground; wherein when the first wire and the ground are electrically connected by the first switch, the second wire and the ground are electrically disconnected by the second switch;

when the second wire and the ground are electrically connected by the second switch, the first wire and the ground are electrically disconnected by the first switch;

when the first wire and the ground are electrically connected by the first switch and the third wire and the ground are electrically connected by the third switch, the second wire and the ground are electrically disconnected by the second switch and the fourth wire and the ground are electrically disconnected by the fourth switch; and when the second wire and the ground are electrically connected by the second switch and the fourth wire and the ground are electrically connected by the fourth switch, the first wire and the ground are electrically disconnected by the first switch, and the third wire and the ground are electrically disconnected by the third switch.

2. The filter module according to claim 1, wherein the first switch is a single pole single throw (SPST) switch; and
the filter module further includes a SPST switch that switches between electrical connection and electrical disconnection between the first wire and an input/output terminal of a signal passing through the first filter.

3. The filter module according to claim 1, wherein the first switch is a single pole double throw (SPDT) switch;
the first wire is connected to a common terminal of the first switch; and
an input/output terminal of a signal passing through the first filter is connected to one of two selection terminals of the first switch, and the ground is connected to the other of the two selection terminals.

4. The filter module according to claim 1, wherein the second switch is a SPST switch; and
the filter module further includes a SPST switch that switches between electrical connection and electrical disconnection between the second wire and an input/output terminal of a signal passing through the second filter.

5. The filter module according to claim 1, wherein the second switch is a SPDT switch;
the second wire is connected to a common terminal of the second switch; and
an input/output terminal of a signal passing through the second filter is connected to one of two selection terminals of the second switch, and the ground is connected to the other of the two selection terminals.

6. The filter module according to claim 1, further comprising:
a second substrate; wherein
the first switch and the second switch are provided in or on the second substrate.

7. The filter module according to claim 1, wherein the first switch and the second switch are provided in or on one chip.

8. The filter module according to claim 1, wherein a pass band of the first filter and a pass band of the second filter are different bands from each other.

9. The filter module according to claim 1, wherein the third switch is a SPST switch; and
the filter module further includes a SPST switch that switches between electrical connection and electrical disconnection between the third wire and an input/output terminal of a signal passing through the first filter.

10. The filter module according to claim 1, wherein the third switch is a SPDT switch;
the third wire is connected to a common terminal of the third switch; and
an input/output terminal of a signal passing through the first filter is connected to one of two selection terminals of the third switch, and the ground is connected to the other of the two selection terminals.

11. The filter module according to claim 1, wherein the fourth switch is a SPST switch; and
the filter module further includes a SPST switch that switches between electrical connection and electrical disconnection between the fourth wire and an input/output terminal of a signal passing through the second filter.

12. The filter module according to claim 1, wherein the fourth switch is a SPDT switch;
the fourth wire is connected to a common terminal of the fourth switch; and
an input/output terminal of a signal passing through the second filter is connected to one of two selection terminals of the fourth switch, and the ground is connected to the other of the two selection terminals.

13. The filter module according to claim 1, further comprising:
a second substrate; wherein
the first switch, the second switch, the third switch and the fourth switch are provided in or on the second substrate.

14. The filter module according to claim 1, wherein the first switch, the second switch, the third switch, and the fourth switch are provided in or on one chip.

15. A filter module comprising:
a first input/output terminal;
a second input/output terminal;
a first filter provided on a path connecting the first input/output terminal and the second input/output terminal;
a third input/output terminal;
a fourth input/output terminal;
a second filter provided on a path connecting the third input/output terminal and the fourth input/output terminal;
a first substrate in or on which the first input/output terminal, the second input/output terminal, the first filter, the third input/output terminal, the fourth input/output terminal, and the second filter are provided;
a first wire connected to the first input/output terminal and through which a signal passing through the first filter is propagated;
a first switch that switches between electrical connection and electrical disconnection between the first wire and the ground;
a second wire connected to the third input/output terminal and through which a signal passing through the second filter is propagated;
a second switch that switches between electrical connection and electrical disconnection between the second wire and the ground;
an amplification circuit that includes a first input terminal connected to the first filter, a second input terminal connected to the second filter, and an output terminal, that amplifies either one of a signal that passes through the first filter and is inputted to the first input terminal or a signal that passes through the second filter and is inputted to the second input terminal, and that outputs an amplified signal from the output terminal;

a fifth switch that switches between electrical connection and electrical disconnection between the first input terminal and the ground; and a sixth switch that switches between electrical connection and electrical disconnection between the second input terminal and the ground; wherein when the first wire and the ground are electrically connected by the first switch, the second wire and the ground are electrically disconnected by the second switch;

when the second wire and the ground are electrically connected by the second switch, the first wire and the ground are electrically disconnected by the first switch;

when the first wire and the ground are electrically connected by the first switch, the first input terminal and the ground are electrically connected by the fifth switch, and the second input terminal and the ground are electrically disconnected by the sixth switch; and when the second wire and the ground are electrically connected by the second switch, the first input terminal and the ground are electrically disconnected by the fifth switch, and the second input terminal and the ground are electrically connected by the sixth switch.

16. The filter module according to claim 15, further comprising:

a second substrate; wherein the first switch, the second switch, the third switch, the fourth switch, the fifth switch, and the sixth switch are provided in or on the second substrate.

17. The filter module according to claim 16, wherein the amplification circuit is provided in or on the second substrate.

18. The filter module according to claim 15, wherein the first switch, the second switch, the third switch, the fourth switch, the fifth switch, the sixth switch, and the amplification circuit are provided in or on one chip.

19. The filter module according to claim 1, wherein the first substrate is further provided with at least one ground terminal connected to the first filter and the second filter;

the first input/output terminal and the third input/output terminal are adjacent to each other without the at least any one ground terminal placed in between; and the second input/output terminal and the fourth input/output terminal are adjacent to each other without the at least any one ground terminal placed in between.

* * * * *